United States Patent [19]

Eramo, Jr. et al.

[11] Patent Number: 5,364,736
[45] Date of Patent: Nov. 15, 1994

[54] PHOTOIMAGEABLE COMPOSITIONS

[75] Inventors: Lincoln Eramo, Jr., San Clemente; William J. Winkler, Tustin, both of Calif.

[73] Assignee: Morton International, Inc., Chicago, Ill.

[21] Appl. No.: 75,356

[22] Filed: Jun. 10, 1993

Related U.S. Application Data

[63] Continuation of Ser. No. 766,189, Sep. 26, 1991, abandoned, which is a continuation of Ser. No. 678,898, Mar. 28, 1991, abandoned, which is a continuation of Ser. No. 506,516, Apr. 6, 1990, abandoned, which is a continuation of Ser. No. 280,120, Dec. 5, 1988, abandoned, which is a continuation-in-part of Ser. No. 130,039, Dec. 7, 1987, abandoned.

[51] Int. Cl.$^5$ .................................................. G03C 1/73
[52] U.S. Cl. ........................... 430/280; 430/271; 430/281; 430/311; 430/325; 430/330; 430/327
[58] Field of Search .............. 430/280, 311, 325, 327, 430/330, 909, 927, 911, 281, 271; 522/100, 103

[56] References Cited

U.S. PATENT DOCUMENTS

| | | | |
|---|---|---|---|
| 3,776,729 | 12/1973 | Levy et al. | 430/288 |
| 3,989,610 | 11/1976 | Tsukada et al. | 430/288 |
| 4,025,348 | 5/1977 | Tsukada et al. | 522/25 |
| 4,268,614 | 5/1981 | Ueyama et al. | 430/327 |
| 4,485,166 | 11/1984 | Harwig et al. | 430/287 |
| 4,786,579 | 11/1988 | Tazawa et al. | 430/280 |
| 4,789,620 | 12/1988 | Sasaki et al. | 430/280 |
| 5,057,394 | 10/1991 | Yabe et al. | 430/911 |

FOREIGN PATENT DOCUMENTS

| | | |
|---|---|---|
| 0206086 | 12/1986 | European Pat. Off. . |
| 280295 | 8/1988 | European Pat. Off. . |
| 62-187722 | 8/1987 | Japan ............... C08G 59/40 |

OTHER PUBLICATIONS

PCT Application Publication WO/89/05476 published Jun., '89.

*Primary Examiner*—Christopher D. Rodee
*Attorney, Agent, or Firm*—Wayne E. Nacker; Gerald K. White

[57] ABSTRACT

A photoimageable composition includes a polymeric binder which is soluble in aqueous solution; a cross-linking agent for the polymeric binder; a polymerizable acrylic substance; a chemical, photosensitive, free radical-generating initiating system; and a liquid epoxy resin composition and an epoxy cure catalyst. In one method of using the photoimageable composition of the present invention, the composition is applied as a film to a substrate, heated to make the film non-tacky but still aqueous-soluble, exposed to actinic radiation, developed in aqueous solutions to wash away non-exposed portions of the film and heat-cured to harden the film.

14 Claims, No Drawings

PHOTOIMAGEABLE COMPOSITIONS

This is a continuation of application Ser. No. 07/766,189 filed Sep. 16, 1991, which was a continuation of application Ser. No. 07/678,898 filed Mar. 28, 1991, which was a continuation of application of Ser. No. 07/506,516 filed Apr. 6, 1990, which was a continuation of application Ser. No. 07/280,120 filed Dec. 5, 1988, which was a continuation-in-part of application Ser. No. 07/130,039 filed Dec. 7, 1987; all prior applications are abandoned.

The present invention is directed to compositions which may be applied as a layer on a substrate, photoimaged, developed and cured to form a patterned, permanent layer, suitable as a solder mask for a printed circuit board or the like.

BACKGROUND OF THE INVENTION

Solder masks are patterned films or layers which are designed to permanently overlie the printed circuitry on a printed circuit board. Patterned openings in solder masks selectively permit solder to adhere to metal of the printed board. The solder mask also protects the circuitry against short-circuiting.

Because solder masks are designed to provide a permanent layer, hardness and durability of the layer are considered important features of a solder mask composition. Among the hardest and most durable of photomask compositions are those which are epoxy-based. Such compositions generally comprise an epoxy resin dissolved in a solvent. A major disadvantage of epoxy compositions is that they are imagewise screen printed, a primitive technology compared to much more desirable photoimaging.

Photoimageable compositions which may be used to form solder masks or the like typically contain a film-forming material, a photo-polymerizable monomer, e.g., an acrylate monomer, and a photoinitiator. Examples of such compositions are described in U.S. Pat. No. 4,528,261. Although such compositions have the advantage of being photoimageable, they are not as strong or as durable as those based upon epoxy resins.

U.S. Pat. No. 4,268,614, the teachings of which are incorporated herein by reference, describes photoimageable compositions which include acrylic resins, acrylic monomers and epoxy resins. The photoimageable compositions described in this '614 patent may be applied as a solution in an organic solvent directly to a circuit board or applied as a solution to a base sheet so as to form a dry film. Compositions such as described in the '614 patent which form a film upon evaporation of an organic solvent are disadvantageous with respect to the use of high levels of organic solvents. In forming films from solutions, the organic solvent typically comprises about one-half of the solution volume. The cost of the solvent, including the shipping and storage of the same, is quite significant. Furthermore, organic solvents, which must be evaporated from the layered compositions, pose substantial health and environmental problems. A further disadvantage of the photoimageable compositions described in the '614 patent is that once photoimaged, the film is developed by washing away the unexposed areas with an organic solvent.

It is an object of the present invention to provide a photoimageable substance which at or near 100% solids may be formed into a film, exposed, developed with aqueous solution and thereafter cured to form a layer with hardness and permanency characteristics similar to films based entirely upon epoxy resins.

SUMMARY OF THE INVENTION

In accordance with the invention, there is provided a photoimageable composition comprising a flowable, aqueous-soluble, film-forming, polymeric binder; a cross-linking agent for the binder; a polymerizable acrylic substance; a photosensitive, free-radical generating material; an epoxy resin; and an epoxy cure catalyst. The aforesaid components are selected to be mutually miscible and are mixed together to form a homogeneous solution. The composition is preferably substantially free of organic solvent, i.e, at or near 100% solids. The substrate may be a surface of a printed circuit board. Alternatively, the substrate may be a backing sheet or other layer of a dry-film laminate from which the photosensitive film is transferred to a printed circuit board or the like. The polymerizable acrylic substance and photosensitive, free-radical generating material provide the means of imaging the film by forming a polymer which insolubilizes those portions of the film which are exposed to actinic radiation. The epoxy resin, as promoted by its cure catalyst, hardens the film so as to be suitable as a solder mask or as a layer in totally additive plating. The binder is selected for its film-forming properties, whereby the photoimageable composition may be used, substantially in the absence of solvents, to form a layer on the substrate. Also, the binder is selected to have sufficient solubility in aqueous or alkaline aqueous solution that the photoimageable composition may be developed in either aqueous or alkaline aqueous solution. Upon sufficient reaction with the cross-linking agent, the binder will harden and become insoluble in aqueous or alkaline aqueous solution and thereby contribute to the permanency of the fully cured layer, e.g., a solder mask, which is eventually formed. However, as described in greater detail hereinafter, it is preferred that the binder and cross-linking agent be selected so that a partial cure may be effected under conditions which do not substantially cure the epoxy resin. For example, compositions according to this invention may be "heat-bumped" under mild conditions of time and temperature to effect a partial cure of the binder that renders the photoimageable composition non-tacky, yet leaves a film of the photoimageable composition soluble in aqueous or alkaline aqueous solution.

DETAILED DESCRIPTION OF CERTAIN PREFERRED EMBODIMENTS

The photoimageable compositions according to the present invention each contains at least the following components: (a) a film-forming polymeric binder which is soluble in aqueous or alkaline aqueous solution, (b) a cross-linking agent for the polymeric binder, (c) a polymerizable acrylic substance, (d) a photosensitive, free radical-generating initiator chemical system, (e) an epoxy resin composition and (f) an epoxy resin. These components (a)–(f) are selected to be mutually miscible and when mixed together form a homogeneous solution. Herein, unless otherwise stated, all percentages are by weight and are calculated relative to the homogeneous solution of components (a)–(f). Thus components (a)+(b)+(c)+(d)+(e)+(f)=100 wt. percent. The amounts of any additional ingredients, such as fillers, solvents, etc. are calculated relative to the sum of (a)–(f).

At the outset, a photoimageable composition, in accordance with the invention, contains a substance (a) or substances capable of forming a film on a substrate. Because it is preferred that the photoimageable composition be substantially free of organic solvent, that is, approaching 100% solids, the film-forming binder material should be liquid at room temperature and preferably free-flowing at room temperature. In order that the photoimageable composition be developable in aqueous or alkaline aqueous solution, the film-forming material itself must be soluble in an aqueous solution, either water or a base-containing aqueous solution. Furthermore, the film-forming material must be compatible with the other components of the photoimageable composition.

One important class of film-forming materials useful as binders in forming photoimageable compositions in accordance with the present invention comprises polymers and copolymers of acrylic acids. These polymers and copolymers contain free carboxyl groups and are therefore soluble in alkaline aqueous solutions. These binders are selected for sufficient solubility in alkaline aqueous solution and are employed at a sufficient weight percent of the photoimageable composition that the photoimageable composition is likewise soluble in alkaline aqueous solutions (until exposure to actinic radiation) and hence developable in alkaline aqueous solution. Generally, the higher the acid number of the acrylic polymeric binder, the more soluble the photoimageable composition is in alkaline aqueous solution and the acrylic polymers and copolymers used in accordance with this invention generally have acid numbers greater than about 100, preferably greater than about 150 and most preferably greater than about 200. To provide a high acid number, the polymeric binder material must be formed from one or more acrylic monomers having a free carboxylic acid group, e.g., acrylic acid and mathacrylic acid.

The selection of binders which are sufficiently soluble in aqueous solution or alkaline aqueous solution and to an extent sufficient to render the entire photoimageable composition soluble and developable in aqueous or alkali aqueous solution contrasts sharply with the photoimageable compositions provided by above-referenced U.S. Pat. No. 4,268,614 which must be developed in organic solvents. Although U.S. Pat. No. 4,268,614 teaches the use of acrylic polymers in photoimageable compositions, the polymers described therein are of low acid number and, therefore, do not render the compositions soluble in alkaline aqueous solutions.

The polymeric binder may, and generally is, formed from additional comohomers, including esters of acrylic acids, such as methyl acrylate, methyl methacrylate, hydroxy ethyl acrylate, butyl methacrylate, octyl acrylate, 2-ethoxy ethyl methacrylate, t-butyl acrylate, 1,5-pentanediol diacrylate, N, N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, trimethylolpropane triacrylate, pentaerythritol triacrylate, 2,2-di(p-hydroxy-phenyl)-propane diacrylate, pentaerythritol tetracrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylol propane triacrylate, ethylene glycol dimethacrylate, butylene glycol dimethacrylate, 1,3-propanediol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, and 1,4-benzenediol dimethacrylate.

Suitable non-acrylate co-monomers which may be incorporated in the binders include, but are not limited to, styrene, vinyl toluene, maleate esters such as dibutyl maleate, maleic anhydride, vinyl ethers, vinyl ketones, vinyl pyridines and allyl acetoacetates.

It will be appreciated by those skill in the art that certain functional groups on the various components of the photoimageable composition will, to a greater or lesser degree, interact with epoxy groups of the epoxy resin, and thereby cause premature cross-linking of the epoxy resin. This is primarily a shelf-life problem, and the level of certain chemical functional groups may have to be limited to provide a desired shelf-life. However, shelf-life is not the only concern in formulating photoimageable compositions, and compositions according to the invention may be finally formulated near to the time of use. Generally, free amine groups cannot be used in the presence of epoxy resins if any degree of shelf-life is to be achieved. Carboxyl groups, hydroxyl groups and amide groups will also initiate epoxy polymerization, though the levels of these groups may be controlled to be consistent with reasonable shelf-life. Where shelf-life is important, e.g., in formulating dry films, it is especially desirable to control the level of epoxy-reactive groups, to the extent that is consistent with other desirable aspects of the photoimageable composition, e.g., providing requisite solubility in alkaline aqueous solution. Thus, for example, where shelf-life is to be extended, it is desirable that the acrylate binder contain few hydroxyl moleties, such as those found in N,N-diethylaminoethyl acrylate, glycerol diacrylate and pentaerythritol triacrylate.

The acrylate-containing polymers having high acid numbers are the preferred film formers or binders for compositions in accordance with this invention, particularly for use as a film on a printed circuit board which must pass IPC/ANSI SM-840A Class III tests. However, because of the large number of acidic groups in these polymers, there are limitations to long-term stability of compositions containing both acrylic film formers and the epoxy resins, which are another component of the photoimageable compositions. The acrylate-containing polymers are, however, compatible with epoxy resins for relatively short periods, and there is generally no urgency to apply these resins immediately after final formulation. Thus, compositions containing both acrylate polymers having free carboxylic acid groups and epoxide resins may be provided as one-part liquid compositions for application to printed circuit boards or even as partially cured (heat-bumped) layers of dry films. The shelf-life of such compositions depends upon the particular components of the system, e.g., the acid number of the particular acrylic binder which is used, and the temperature at which the composition is stored prior to use. The compatibility problems of epoxy resins in the presence of free carboxyl groups may, however, require liquid compositions or dry films formed there-from to be used within a shorter period of time than is customary in the art. Because of the long-term compatibility problem of the acrylate-containing binder polymers and epoxy resins, a composition may be provided commercially as a two-part system, one part containing the acrylate-containing binder and the other part containing the epoxy resin. The remaining components are appropriately distributed among the two parts of the system, it being generally desirable in such two-part systems to keep curing agents separate from the corresponding polymerizable or cross-linkable materials.

Another type of material used as binders in photoimageable compositions in accordance with the present invention are styrene-maleic anhydride copolymers in which the mer units derived from maleic anhydride remain in the anhydride state. The polymers, while having no free hydroxyl or carboxylic acid groups, may be saponified in alkaline solution to the acid form. Styrene-maleic anhydride copolymers, which are saponifiable to acid numbers of about 100 or more, are preferred, as they provide good solubility in aqueous solution.

A type of film-forming binder which is long-term compatible with epoxy resins is polyvinyl alcohols. Polyvinyl alcohols are substantially saponified polyvinyl acetates, preferably being at least about 80% hydrolyzed. Polyvinyl alcohols are available in a wide variety of viscosities, and viscosities are selected for the particular application.

Carboxylated polyvinyl alcohols are similar to polyvinyl alcohols, but between about 1 and about 5% of the per units contain free carboxyl groups. Carboxylated polyvinyl alcohols are formed by copolymerizing vinyl acetate and an alkyl ester of acrylic acid and then hydrolyzing the ester bonds of the polymer. Carboxylated polyvinyl alcohols are hydrolyzed to at least about 75%. Because of the free carboxyl groups, this polymer is somewhat less compatible with epoxy resins.

Polyvinyl alcohols suitable for use in accordance with the invention are available from Air Products, Allentown, Pa., under the tradenames Vinol 125, 165, 107, 325, 350,425, WS-42, 205, 523, 540,205S, 523S and 540S. Carboxylated polyvinyl alcohols suitable for use in the invention are sold by Air Products, e.g., under the trade name Vinol 118M. Polyvinyl alcohol and carboxylated polyvinyl alcohol, unlike the acrylate-containing polymers having high acid numbers, are soluble in water, generally regardless of the pH, and therefore do not require basic developers, that is, photoimageable compositions based upon these binder materials may be developed in water. Polyvinyl alcohol and carboxylated polyvinyl alcohols are considered less desirable binders as compared with acrylate binders with respect to hardness and water-susceptability of the finally cured film.

Novolac resins, such as those described in *Polymer Chemistry*, Malcolm P. Stevens, Addison-Wesley Publishing Company, Inc., Reading, Mass., (1975) pp 324–327, the teachings of which are incorporated herein by reference, are also suitable as binders. Novolac resins have relatively good stability with epoxy resins (an advantage in one part formulations) and can be used to form binders which pass Class III standards.

Other suitable film-forming resins for use in the invention include, but are not limited to, cellulose, and hydroxyethyl cellulose. Furthermore, mixtures of the several polymeric binders discussed above may be included in a photoimageable composition formulation.

The polymeric binder or mixture of polymeric binder materials comprises between about 10 and about 40% by weight of the homogeneous solution of components (a)–(f), preferably between about 15 and about 25% by weight.

The photoimageable composition is applied as a viscous, tacky, flowable liquid to a substrate, such as a printed circuit board or to a backing sheet to form a dry film. As explained in greater detail hereinafter, it is often desired that the photoimageable composition be partially curable to either partially harden or to insolubilize the film, and to this end, the photoimageable composition contains a cross-linking agent (b) which cross-links the binder and may also cross-link certain other components of the photoimageable composition.

Desirably, the cross-linking agent acts primarily at temperatures somewhat above room temperature, e.g., above 35° C., whereby the photoimageable composition may be applied to a substrate at or near room temperature and subsequently heat-bumped to effect a controlled level of cross-linking. It is important for several applications that the controlled level of cross-linking be effected using relatively mild temperatures and in a relatively short period of time. By relatively mild temperatures and relatively short periods of time, is herein meant, in comparison to the substantially higher temperatures and/or longer periods of time required to finally cure the epoxy resins, as described hereinafter.

Preferred cross-linking agents are melamine-formaldehyde condensation products, such as those sold under the trademark Resimene by Monsanto, St. Louis, Mo. or Cymel by American Cyanimide. The functional groups on the amino moieties react with complementary reactive groups, e.g., hydroxyl groups, on the resin, forming a three-dimensional thermoset polymer network. Other suitable cross-linking agents include urea-formaldehyde resins and phenolic resols. Novolac resins may be cross-linked by formaldehyde, paraformaldehyde or hexamethylene tetramine. The cross-linking agent comprises between about 5 and about 25% by weight of the homogeneous solution of components (a)–(f). Generally for photoimageable compositions which are to be applied as a liquid film, the amount of the cross-linking agent is toward the lower end of this range; in forming dry films, the amount of the cross-linking agent is toward the upper end of this range.

The photoimaging system is based upon the polymerizable acrylic substances (c). The polymerizable acrylic substances are generally monomers containing one or more acrylic moieties. They can, however, contain acrylic dimers or trimers. Any of the acrylic monomers listed above as components of an acrylic polymeric binder is suitable as a polymerizable acrylic substance for purpose of this invention. Mixtures of acrylates are also suitable. As in polyacrylate binder, the polymerizable acrylate substance(s) must be selected with the intended shelf-life of the photoimageable composition in mind, and levels of free carboxyl, hydroxyl, amide and other epoxy-reactive functional groups appropriately controlled. The polymerizable acrylic materials comprise between about 15 and about 35 wt. percent of homogeneous solutions (a)–(f) according to the invention and preferably from about 18 to about 25 wt. percent.

In some cases, it has been found to be advantageous to use an acrylic monomer that includes at least one free hydroxyl group, for example, hydroxy alkyl acrylates and methacrylates, such as pentaerythritol tetraacrylate, 2-hydroxy ethyl acrylate, 2-hydroxy ethyl methacrylate and 2-ethoxy ethyl methacrylate. The free hydroxy groups are acted upon by the cross-linking agent during the heat-bump, chemically linking at least some of the polymerizable acrylates to the polymeric binder and thereby providing a more integrated cross-linked film structure.

Also required in conjunction with the polymerizable acrylate substance is a chemical initiator system which generates free radicals in the presence of actinic radiation and polymerizes the acrylic substance. Polymerization of acrylic monomer units into a three-dimensional structure insolubilizes the photoimageable composition by immobilizing the polymeric binder. The choice of the photosensitive, free radical-generating initiator system is not considered to be critical to the practice of the present invention, and a wide variety of such compounds may be successfully utilized in the practice of this invention. Examples of chemical photoinitiator systems include benzophenone, benzoin ether, benzil ketals and acetophenone and its derivatives. Other suitable initiator systems are described, for example, in U.S. Pat. Nos. 3,469,982, 4,451,523 and 4,358,477, the teachings of which are incorporated herein by reference. The amount of photoinitiator employed may vary over a wide range, depending upon the polymerizable acrylic substance(s), the particular photoinitiator system and the desired time of development. Generally, the photoinitiator chemical system comprises between about 0.01 and about 15 wt. % of the homogeneous solution (a)-(f).

The material which imparts the excellent hardness and durability to the film or layer after development and final curing is the epoxy resin or mixture of epoxy resins. The epoxy resin or resins comprise between about 20 and about 50 percent by weight of the homogeneous solution (a)-(f). At high temperatures and/or in the presence of a catalyst, the epoxy groups of the resin molecules open and react with other materials present. Primarily the epoxy resin molecules react with each other; however, to a certain extent, the epoxy molecules react during final curing with the cross-linking agent, and perhaps also with the acrylic binder material and the remaining polymerized and unpolymerized acrylate substances. The major consideration of selection of the epoxy resin or mixture of resins is that the epoxy resin composition be a liquid at about room temperature, whereupon the photoimageable composition can be applied as a liquid film to the substrate. Generally, lower molecular weight epoxies, e.g., having molecular weights between about 240 and about 260, tend to be liquid, and preferably at least about 70% by weight of the epoxy resins comprises polyepoxy molecules having molecular weights below 260. It is permissible, however, to dissolve higher molecular weight, solid epoxies in the lower molecular weight, liquid epoxies, providing that the combination of epoxy resins is liquid. Higher molecular weight epoxies may be advantageously incorporated into a photoimageable composition to control viscosity of the photoimageable composition. The inclusion of some higher molecular weight epoxy resin dissolved in lower molecular weight epoxy resin may result in formation of a harder, more durable film.

A wide variety of epoxy resins are suitable for use in accordance with the present invention. Suitable epoxy resins are described, for example, in U.S. Pat. No. 4,092,443, the teachings of which are incorporated herein by reference. Preferred epoxy resins for purpose of the invention are cycloaliphatic epoxides, such as those sold under the trade names Cyanacure UVR-6100 and UVR-6110 by Union Carbide, Danbury, Conn.

Epoxy resins are generally heat-curable; high temperatures open the epoxy groups, thereby causing them to react. Several applications of photoimageable compositions in accordance with the invention require that curing of the epoxy resin composition takes place at a higher temperature and/or is cured over a longer period of time than the temperature and time required for the heat-bump, during which the acrylic binder is cross-linked to a controlled extent. Although some degree of curing of the epoxy resins may take place continuously and even at a somewhat-increased rate during the heat-bump, the epoxy resin composition in several applications must remain substantially uncured until after exposure to patterned actinic radiation and development. Once the epoxy resin composition cures to any appreciable extent, the photoimageable composition becomes insoluble in aqueous and alkaline aqueous solutions and therefore non-developable. Accordingly, the epoxy resin composition is further selected so as to be curable under harsher conditions of time and temperature than are required for the initial heat-bump.

The photoimageable composition includes a cure catalyst for the epoxy resin composition which promotes more rapid curing at the final heat cure temperature. Suitable heat-activated curing agents include polycarboxylic acid anhydrides, dicyandiamides, complexes of amines, such as solely tertiary amines, with boron trifluoride or boron trichloride, latent boron difluoride chelates, aromatic polyamines and imidazoles, such as 2-ethyl-4-methylimidazole. Other examples of epoxy cure catalysts are found in U.S. Pat. No. 4,438,189, the teachings of which are incorporated herein by reference. Preferred epoxy catalysts are blocked or latent catalysts, such as those sold under the trade name SA-102 by Air Products. Such catalysts have an epoxy-catalyzing group, e.g., an acid group or amine or amide group, appropriately blocked. At a threshold temperature, the catalyst releases its blocking group and catalyzes epoxy ring opening. The threshold activation temperature of such catalysts is particularly advantageous in a process which includes an initial, relatively low-temperature, relatively short-time heat-bump and a subsequent heat-cure under more vigorous temperature/time conditions. Epoxy cure catalysts are used at levels of from about 0.01 to about 5 wt. percent of the homogeneous solution (a)-(f).

The components of the photoimageable composition are selected to be mutually soluble to form a single-phase liquid composition. The liquid photoimageable composition may be applied to a substrate by a variety of application methods, including screen printing, curtain coating, roller coating and extrusion coating. Each application method has its own particularities, and photoimageable compositions in accordance with this invention may be formulated in accordance with the particular requirements of the particular method of application, e.g., to provide a suitable photoimageable composition viscosity.

It may be appreciated at this time that all of the components described above remain present in the final cured film which is formed, that is, the formulation supplies substantially 100% solids. This is an important advantage of the photoimageable compositions of the present invention, in contrast to films which are formed by solvent evaporation. It is contemplated, however, that the photoimageable composition may contain minor amounts of organic solvent, e.g., up to about 20% by weight relative to the homogeneous solution (a)–(f) and preferably less than about 2% by weight. Some solvent may be present only because certain of the components of the system may be commercially provided along with a volatile organic solvent.

In addition to the components described above which are essential to a photoimageable composition in accordance with the invention, the photoimageable composition may optionally contain additional components which are standard in the art. The photoimageable composition may contain organic or inorganic fillers at levels up to about 35 wt. percent relative to the homogeneous solution (a)–(f). Some examples of fillers are micro talc, ground polyethylene, clay, fumed silica and polyvinyledene fluoride. Also, relatively small amounts of flow-control agents, antioxidants, dyes, etc. may be added.

The compositions in accordance with the invention which provide a photoimaging reaction in combination with a two-stage cure are useful in several types of applications, and advantages of the compositions will become more fully appreciated as the use of these compositions is discussed with respect to several applications. It will be appreciated, that the exact formulation and treatment conditions for any formulation will depend upon the application to which it is to be put.

An important use of the compositions of the present invention is for direct application to a printed circuit board where contact printing is to be employed. The composition is applied as a layer on the surface of the board. Subsequent to application of the photoimageable composition to the surface, the photoimageable composition is heat-bumped for a controlled period of time so that the photoimageable composition for ins a non-tacky layer, yet leaves the photoimageable composition soluble in an appropriate aqueous solution. The heat-bump takes place at a controlled temperature and for a controlled time period to achieve the non-tacky condition; however, care must be taken to avoid excess cross-linking of the several components which would render the photoimageable composition insoluble in aqueous or alkaline aqueous solutions. Heat-bump times and temperatures must be determined for each particular photoimageable composition. For any particular photoimageable composition, different temperatures may be used with different times. Typically, heat-bump temperatures range from about 70°–100° C. at times of from 5 to 60 min.; however, it can easily be appreciated that lower temperatures with longer heat-bump times may be employed.

During the heat-bump, the primary reaction is between the cross-linking agent and the polymeric binder; however, minor reactions probably involve interactions between a number of components. Heat-bump reactions contribute to non-tackiness of the film. For applications where the film is to remain soluble and developable in an appropriate aqueous or alkaline aqueous solution, reactions which occur during the heat-bump must be consistent with continued solubility of the film.

For contact printing and dry film applications, the non-tacky, but developable film which forms after the heat-bump is ready for exposure to actinic radiation. For contact-printing, the artwork, e.g., diazo artwork, is laid directly on the film. The non-tacky nature of the film at this stage enables the artwork to be contacted with the film. As those with skill in the art readily appreciate, contact printing is generally preferred over remote exposure techniques for producing sharply defined images. Light intensities (which generally depends upon the unit used) and exposure times (which are generally determined by the operator) determine the light energy applied during exposure. Required light energies for exposure depends primarily on the polymerizable acrylic substances and the photoinitiator systems used and amounts thereof. Exposure must be determined for each photoimageable composition.

For non-contact printing, the film may be exposed either after a heat-bump, which leaves the film soluble in aqueous or alkali aqueous solution, or with the film in unaltered, tacky form.

Subsequent to exposure, the non-exposed portions are dissolved and washed away in aqueous or alkaline aqueous solution. Films based upon polyvinyl alcohol, carboxylated polyvinyl alcohol, cellulose or the like are soluble in water and may be developed in an aqueous solution, including water. Photoimageable compositions based upon acrylic binder-containing films having high acid numbers, on the other hand, must be developed in an alkaline aqueous solution. Typical alkaline developers contain from 0.5 to about 3% by weight of a weak base, such as potassium carbonate, sodium carbonate or ammonium hydroxide or from about 0.4% to about 3% by weight of a strong base, such as sodium hydroxide or potassium hydroxide. Novolac-containing films are also developed in alkaline aqueous developers.

The ability to be developed with aqueous or alkaline aqueous solutions is considered to be an important advantage of the photoimageable composition of the present invention. Eliminating the need for solvent-based developers eliminates the cost of the solvents as well as health, environmental and recycling problems. Although the films formed in accordance with the invention are developable in aqueous solutions without any organic solvents, developers may include some organic solvents, providing that the added organic solvent does not solubilize the exposed portions of the film.

Following development, it is preferred to again expose the film to actinic radiation to effect a UV-cure. The UV-cure is optional, but is helpful in producing a stronger permanent film. Primarily, the UV-cure is believed to polymerize or cross-link any remaining polymerizable acrylic substance.

The primary cure of the exposed and developed film is the thermal cure which opens the epoxy groups of the epoxy resin molecules, resulting in cross-linking of the epoxy resin molecules with each other and with the other materials in the film. The thermal cure is generally carried out at temperatures ranging from about 100° C. to about 200° C. for a period of from about 15 min. to about 2 hrs. A typical cure would be 150° C. for an hour. The actual cure time and cure temperature depends upon the epoxy resin used, the epoxy cure catalyst and the amounts of each. If a blocked or latent epoxy cure catalyst is used, curing is done at a temperature above that which deblocks the catalyst.

It is very often the case that a solder mask must be applied to two sides of a printed circuit board. Generally, for contact printing of a solder mask on both sides of a printed circuit board, the following modification of the above-described procedure is followed. The composition is applied to "side 1" of the board; the composition is heat-bumped to non-tackiness and the board is cooled. The composition is applied to "side 2" of the board; the composition is heat-bumped to non-tackiness and the board is cooled. The two sides are then contact-printed, and both sides of the board are developed simultaneously by washing the board in water or alkaline solution, as appropriate. Final curing is then effected. It may be appreciated that "side 1" is "heat-bumped" for a longer period of time than is "side 2". Careful control of the two heat-bumps is required so that "side 2" can be heat-bumped to non-tackiness while leaving "side 1" still soluble in the developer. The composition must therefore be formulated so as to provide a sufficiently wide "cure window" of heat-bump time which provides a non-tacky, yet developable film.

It is also contemplated that the photoimageable composition of the present invention be used for off-contact printing using highly collimated light for good resolution. Other considerations may apply when off-contact printing is used. Particularly, it is not necessary that a non-tacky layer be provided prior to exposure, and even a film of viscous liquid may be exposed. Nevertheless, the two-stage cure provided by the compositions of the present invention is advantageous for off-contact printing.

A typical procedure for off-contact printing of two sides of a printed circuit board is as follows. The composition is applied as a film to "side 1" of the circuit board. The film is exposed to patterned actinic radiation. Resulting polymerization of the acrylic substance both hardens the exposed portions of the film and renders such portions insoluble to developer. The film is then developed in aqueous (or aqueous alkaline) solution. At this time, a heat-bump is employed to sufficiently harden and render non-tacky the portions of the film which remain so that these portions are not lost during subsequent handling of the board. This heat-bump further insolubilizes the remaining portions of the film, protecting the film against treatment of "side 2". A film of composition is then applied to "side 2"; the film is exposed and the film on "side 2" is developed. At this point, the board is baked, resulting in cross-linking of the binder on "side 2" and curing of the epoxy resin on both sides of the board. It can be appreciated that the "window" of curing provided by the heat-bump in this procedure, where the heat-bump of side 1 follows exposure and development, may differ from that required in the contact printing procedure, described above, in which the heat-bump precedes exposure and development. In either case, the intermediate cure achieved during the "heat-bump", as provided by the acrylic binder, obviates the need to fully cure the epoxy resin of "side 1" before proceeding with treatment of "side 2".

In forming a dry film, the photoimageable composition is applied as a layer to the backing sheet and then heat-bumped to non-tackiness. The film is subsequently transferred from the backing sheet to a solid substrate, e.g., a printed circuit board, and then exposed, developed and cured as discussed above.

In forming a dry film, general considerations and techniques of dry film application apply. The film must be selectively adherent to the substrate as compared to its adherence to the backing sheet material, e.g., polyethyleneterphthalate. The backing sheet may be appropriately coated to provide such selective adherence. The dry film may also include other layers, such as an oxygen-impermeable membrane, e.g., polyethylene, which remains on the film until just prior to or following exposure to radiation and which is then removed to allow development of the layer.

The invention will now be described in greater detail by way of specific examples.

EXAMPLE 1

A photoimageable composition having the following composition was prepared:

| Component | % Wt. |
| --- | --- |
| acrylic resin (binder), acid no. 200 | 22.6 |
| 1,8 diaza-bicyclo-(5,4,0)-undecene-7-phenol salt | 1.2 |
| equal wt. mixture of (a) hydroxyethyl methacrylate, (b) bisphenol A diacrylate, and (c) dipentaerithritol monohydroxy pentaacrylate | 21.8 |
| 2,2 dimethyl 2 phenyl-acetophenone | 3.0 |
| liquid cycloalphatic monoepoxy, epoxy equiv. 120–130 | 42.4 |
| methylated melamine | 9.0 |
| | 100.0 |
| plus | |
| leveling agent | 1.2 |
| pigment (phthalocyanine green CI#74260) | 1.2 |
| Fillers | |
| fumed silica | 1.8 |
| micro talc | 14.4 |
| ground polyethylene | 0.9 |

The photoimageable composition was applied as a 0.0381 mm thick layer on a printed circuit board. The photoimageable composition was heat-bumped at 80° C. for 30 minutes, providing a non-tacky film. A diazo artwork was placed directly on the film, and the film was exposed to actinic radiation having an intensity of 200 mJ/cm$^2$ for 1 min. The film was then developed in a basic aqueous solution, i.e., 1% by weight sodium carbonate monohydrate. The film was UV-cured by exposure to actinic radiation having an intensity of 2 Joules for 2 min. Heat-curing was at 150° C. for 1 hour.

The following additional compositions according to this invention are prepared and processed in accordance with Example 1.

EXAMPLE 2

| Components | % Wt. |
| --- | --- |
| Acrylic resin with minimum acid number of two hundred | 37.3 |
| Hydroxyethyl acrylate | 26.8 |
| Hexamethylmelamine | 10.9 |
| Benzophenone | 1.9 |
| Liquid cycloalphatic diepoxy | 22.6 |
| 1,8 diaza-bicyclo-(5,4,0) undecene 7 | 0.5 |
| | 100.0 |
| plus | |
| Leveling agent | 1.2 |
| Pigment (phthalocyanine green CI#74260) | 1.2 |
| Fillers | |
| polyvinylidene fluoride | 9.3 |
| micro talc | 22.3 |

EXAMPLE 3

| Component | % Wt. |
| --- | --- |
| Styrene maleic anhydride, acid no. 200, M.W. 10,000 | 22.2 |
| Trimethylolpropane triacrylate | 33.9 |
| Butylated melamine | 5.6 |
| Isobutyl benzoin ether | 0.9 |
| Solid bisphenol-A epoxy, epoxy equiv. 525–1800 | 35.8 |
| 1,8 diaza-bicyclo-(5,4,0)-undecene-7-ethyl hexanoic acid salt | 1.6 |
| | 100.0 |
| plus | |
| Leveling agent - A | 1.2 |

-continued

| Component | % Wt. |
|---|---|
| Pigment (phthalocyanine green CI#74260) | 1.2 |
| Fillers | |
| clay | 3.6 |
| micro talc | 6.2 |
| ground polyethylene | 1.1 |

EXAMPLE 4

| Component | % Wt. |
|---|---|
| Styrene maleic anhydride, acid no. 200, - m.w. 10,000 | 28.8 |
| Ethoxylated trimethylolpropane triacrylate | 16.7 |
| Methyl-butyl melamine | 22.3 |
| Isopropyl thioxanthone | 2.5 |
| Solid multifunctional novalac epoxy | 27.7 |
| 1,8 diaza-bicyclo-(5,4,0)-undecene-7-p-toluene sulfonic acid salt | 1.0 |
| | 100.0 |
| plus | |
| Leveling agent | 1.2 |
| Pigment (phthalocyanine green CI#74260) | 1.2 |
| Fillers | |
| fumed silica | 1.8 |
| micro talc | 14.4 |
| ground polyethylene | 0.9 |

EXAMPLE 5

| Component | % Wt. |
|---|---|
| Acrylic resin with minimum acid number of two hundred | 35.9 |
| Diethyleneglycol diacrylate | 15.7 |
| Hexa-alkoxy methylol melamine resin | 23.8 |
| 2 chlorothioxanthone | 4.1 |
| Liquid cycloalphatic monoepoxy, epoxy equiv. 120–130 | 20.2 |
| 1,8 diaza-bicyclo-(5,4,0)-undecene-7-formic acid salt | 0.3 |
| | 100.0 |
| plus | |
| Leveling agent | 1.2 |
| Pigment (phthalocyanine green CI#74260) | 1.2 |
| Fillers | |
| fumed silica | 1.8 |
| micro talc | 14.4 |
| ground polyethylene | 0.9 |

EXAMPLE 6

| Components | % Wt. |
|---|---|
| Styrene maleic anhydride, acid no. 200, -m.w. 10,000 | 17.3 |
| Polyethylenglycol diacrylate | 20.1 |
| Unsaturated acrylic melamine | 20.4 |
| Isobutyl benzoin ether | 3.3 |
| Solid multifunctional novalac epoxy | 37.7 |
| 1,8 diaza-bicyclo-(5,4,0)-undecene-7-phenol salt | 1.2 |
| | 100.0 |
| plus | |
| Leveling agent | 1.2 |
| Pigment (phthalocyanine green CI#74260) | 1.2 |
| Filler | |
| clay | 22.1 |

EXAMPLE 7

| Components | % Wt. |
|---|---|
| Acrylic resin with minimum acid number of two hundred | 12.2 |
| Tetraethyleneglycol diacrylate | 31.8 |
| Butyl-esterified-phenol formaldehyde | 5.7 |

-continued

| Components | % Wt. |
|---|---|
| Diethoxy-2-methyl-1-phenylpropane-1-one | 3.7 |
| Liquid cycloalphatic monoepoxy | 45.6 |
| 1,8 Diaza-bicyclo-(5,4,0)-undecene-7-ethyl-hexanoic acid salt | 1.0 |
| | 100.0 |
| plus | |
| Leveling agent | 1.2 |
| Pigment (phthalocyanine green CI#74260) | 1.2 |
| Fillers | |
| fumed silica | 1.8 |
| micro talc | 14.4 |
| ground polyethylene | 0.9 |

EXAMPLE 8

| Components | % Wt. |
|---|---|
| Acrylic resin with minimum acid number of two hundred | 21.5 |
| Cyclohexyl acrylate | 18.3 |
| Butylated urea | 14.9 |
| 2,2 dimethyl-2-phenyl-acetophenone | 2.2 |
| Solid bisphenol-A-epoxy, epoxy equiv. 525–1800 | 42.1 |
| 1,8 Diaza-bicyclo-(5,4,0)-undecene-7-phenol salt | 1.0 |
| | 100.0 |
| plus | |
| Leveling agent | 1.2 |
| Pigment (phthalocyanine green CI#74260) | 1.2 |
| Fillers | |
| fumed silica | 32.3 |

EXAMPLE 9

| | % Wt. |
|---|---|
| Acrylic resin with minimum acid number of two hundred | 30.3 |
| Isodecylglycol triacrylate | 16.2 |
| Methylated urea | 14.3 |
| 2,2-dimethyl-2-phenyl-acetophenone | 2.1 |
| Liquid cycloaliphatic diepoxy, epoxy equiv. 120–145 | 35.3 |
| 1,8 diaza-bicyclo-(5,4,0)-undecene-7 | 1.8 |
| | 100.0 |
| plus | |
| Leveling agent | 1.2 |
| Pigment (phthalocyanine green CI#74260) | 1.2 |
| Fillers | |
| fumed silica | 1.8 |
| micro talc | 14.4 |
| ground polyethylene | 0.9 |

While the invention has been described in terms of certain preferred embodiments, modifications obvious to one with ordinary skill in the art may be made without departing from the scope of the present invention.

Various features of the invention are set forth in the following claims.

What is claimed is:

1. A photoimageable composition comprising a homogeneous solution of
    (a) between about 10 and about 40 wt. percent of a flowable, film-forming polymeric binder which has an acid number of about 100 or greater and is soluble in alkaline aqueous solution, said binder being selected from the group consisting of acrylic polymers and copolymers and saponified styrene-maleic anhydride copolymers,
    (b) between about 5 and about 25 wt. percent of a cross-linking agent for said polymeric binder selected from the group consisting of melamine-formaldehyde condensation products, and urea-formaldehyde resins, which cross-linking agent is reactive with complementary group of said polymeric binder, (c) between about 15 and about 35 wt. percent of a polymerizable acrylic substance, (d) between about 0.01 and about 15 wt. percent of a photosensitive, free radical-generating initiator chemical system which in the presence of actinic radiation initiates polymerization of said acrylic substance to form a three-dimensional chemical structure that renders actinic radiation-exposed portions of said photoimageable composition insoluble to alkaline aqueous solutions, (e) between about 20 and about 50 wt. percent of an epoxy resin composition which is curable with heat to harden said photoimageable composition subsequent to exposure to actinic radiation, and (f) between about 0.01 and about 5 wt. percent of a cure catalyst for said epoxy resin selected from the group consisting of polycarboxylic acid anhydrides, dicyandiamides, complexes of amines with boron trifluoride or boron trichloride, latent boron difluoride chelates, aromatic polyamines and imidazoles, said polymeric binder being sufficiently soluble in alkaline aqueous solution and used at a sufficient level that said photoimageable composition as a whole is developable in alkaline aqueous solution, said components (a)-(f) being selected to be mutually miscible and mixed together to form said homogeneous solution, said cross-linking agent reacting with said polymer binder in a controlled manner, whereby said photoimageable composition may be mildly heated to render said photoimageable composition non-tacky, yet developable in alkaline aqueous solution, said epoxy resin being selected so that any curing of said epoxy resin during said mild heating conditions leaves said photoimageable composition soluble in alkaline aqueous solution.

2. A photoimageable composition according to claim 1 wherein said cure catalyst is a latent catalyst having blocking moieties, said catalyst becoming unblocked above a threshold temperature, whereupon cure of said epoxy resin is promoted above said threshold temperature.

3. A photoimageable composition according to claim 1 wherein said binder is formed at least in part from acrylic monomers having free carboxylic acid groups, said binder having an acid number of at least about 100.

4. A photoimageable composition according to claim 1 further comprising a dispersible organic or inorganic filler at a level of up to about 35 wt. percent relative to said homogeneous solution of components (a)-(f).

5. A photoimageable composition according to claim 1 wherein said epoxy resin composition is liquid at about room temperature.

6. A composition in accordance with claim 1 having no more than about 20% by weight organic solvents, relative to said homogeneous solution of components (a)-(f).

7. A composition in accordance with claim 1 having no more than about 2% by wt. organic solvents, relative to said homogeneous solution of components (a)-(f).

8. A composition in accordance with claim 1 free of organic solvents.

9. A photoimageable composition in accordance with claim 1 wherein said initiator chemical system (d) is present at levels from about 0.01 and about 5 wt. percent.

10. A method of preparing a dry film comprising:

(1) providing a photoimageable composition comprising a homogeneous solution of (a) between about 10 and about 40 wt. percent of a flowable, film-forming polymeric binder which has an acid number of about 100 or greater and is soluble in alkaline aqueous solution, said binder being selected from the group consisting of acrylic polymers and copolymers and saponified styrene-maleic anhydride copolymers; (b) between about 5 and about 25 wt. percent of a cross-linking agent for said polymeric binder selected from the group consisting of melamine-formaldehyde condensation products, and urea-formaldehyde resins, which cross-linking agent under mild heating conditions cross-links said binder to render said photoimageable composition non-tacky, while leaving said photoimageable composition solution soluble in alkaline aqueous solution, which cross-linking agent is reactive with complementary groups of said polymeric binder; (c) between about 15 and about 35 wt. percent of a polymerizable acrylic substance; (d) between about 0.1 and about 15 wt. percent of a photosensitive, free radical-generating initiator chemical system which in the presence of actinic radiation initiates polymerization of said acrylic substance to form a three-dimensional chemical structure which renders actinic radiation-exposed portions of said photoimageable composition insoluble to alkaline aqueous solutions; (e) between about 20 and about 50 wt. percent of an epoxy resin composition which is curable for sufficient time and/or high temperature to harden said photoimageable composition subsequent to exposure to actinic radiation, said epoxy resin being selected to be insufficiently cured under said mild heating conditions to render said photoimageable composition insoluble in alkaline aqueous solution, and (f) between about 0.01 and about 5 wt. percent of a cure catalyst for said epoxy resin selected from the group consisting of polycarboxylic acid anhydrides, dicyandiamides, complexes of amines with boron trifluoride or boron trichloride, latent boron difluoride chelates, aromatic polyamines and imidazoles, said components (a)-(f) being selected to be mutually miscible and mixed together to form said homogeneous solutions, (2) applying said photoimageable composition as a film on a backing sheet, and (3) heating said film of photoimageable composition for such time and temperature as to sufficiently cross-link said binder to render said film non-tacky yet still soluble in alkaline aqueous solution.

11. A method in accordance with claim 10 wherein said initiator chemical system (d) is present at levels from about 0.01 and about 5 wt. percent.

12. In combination, a substrate and a layer of photoimageable composition thereon, said photoimageable composition comprising a homogeneous solution of (a) between about 10 and about 40 wt. percent of a flowable, film-forming polymeric binder which has an acid number of about 100 or greater and is soluble in alkaline aqueous solution, said binder being selected from the group consisting of acrylic polymers and copolymers and saponified styrene-maleic anhydride copolymers, (b) between about 5 and about 25 wt. percent of a cross-linking agent for said polymeric binder selected from the group consisting of melamine-formaldehyde condensation products, and urea-formaldehyde resins, which cross-linking agent is reactive with complementary group of said polymeric binder, (c) between about 15 and about 35 wt. percent of a polymerizable acrylic substance, (d) between about 0.01 and about 15 wt. percent of a photosensitive, free radical-generating initiator chemical system which in the presence of actinic radiation initiates polymerization of said acrylic substance to form a three-dimensional chemical structure that renders actinic radiation-exposed portions of said photoimageable composition insoluble to alkaline aqueous solutions, (e) between about 20 and about 50 wt. percent of an epoxy resin composition which is curable with heat to harden said photoimageable composition subsequent to exposure to actinic radiation, and (f) between about 0.01 and about 5 wt. percent of a cure catalyst for said epoxy resin selected from the group consisting of polycarboxylic acid anhydrides, dicyandiamides, complexes of amines with boron trifluoride or boron trichloride, latent boron difluoride chelates, aromatic polyamines and imidazoles, said polymeric binder being sufficiently soluble in alkaline aqueous solution and used at a sufficient level that said photoimageable composition as a whole is developable in alkaline aqueous solution, said components (a)–(f) being selected to be mutually miscible and mixed together to form said homogeneous solution, said cross-linking agent reacting with said polymer binder in a controlled manner, whereby said photoimageable composition may be mildly heated to render said photoimageable composition non-tacky, yet developable in alkaline aqueous solution, said epoxy resin being selected so that any curing of said epoxy resin during said mild heating conditions leaves said photoimageable composition soluble in alkaline aqueous solution.

13. A combination in accordance with claim 12 wherein said substrate is a printed circuit board, said layer of photoimageable composition being processable to provide a solder mask.

14. A combination in accordance with claim 12 wherein said substrate is a flexible backing sheet, said backing sheet and said photoimageable composition layer being partially curable by cross-linking of said binder to form a dry film which is developable in alkaline aqueous solution.

* * * * *